United States Patent
Ji et al.

(10) Patent No.: US 10,529,425 B2
(45) Date of Patent: Jan. 7, 2020

(54) SEMICONDUCTOR APPARATUS

(71) Applicant: SK hynix Inc., Icheon-si Gyeonggi-do (KR)

(72) Inventors: Jung Hwan Ji, Hwaseong-si (KR); Sang Ho Lee, Cheongju-si (KR); Ho Don Jung, Seoul (KR); Jun Hyun Chun, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/041,559

(22) Filed: Jul. 20, 2018

(65) Prior Publication Data
US 2019/0198110 A1 Jun. 27, 2019

(30) Foreign Application Priority Data
Dec. 21, 2017 (KR) ........................ 10-2017-0176837

(51) Int. Cl.
| | |
|---|---|
| *G11C 8/00* | (2006.01) |
| *G11C 16/08* | (2006.01) |
| *G11C 8/10* | (2006.01) |
| *G11C 11/408* | (2006.01) |
| *G11C 7/18* | (2006.01) |
| *G11C 8/12* | (2006.01) |
| *G11C 5/02* | (2006.01) |
| *G11C 11/4097* | (2006.01) |
| *G11C 7/08* | (2006.01) |
| *G11C 11/4091* | (2006.01) |
| *G11C 11/4096* | (2006.01) |

(52) U.S. Cl.
CPC .............. *G11C 16/08* (2013.01); *G11C 5/025* (2013.01); *G11C 7/18* (2013.01); *G11C 8/10* (2013.01); *G11C 8/12* (2013.01); *G11C 11/4087* (2013.01); *G11C 11/4097* (2013.01); *G11C 7/08* (2013.01); *G11C 11/4091* (2013.01); *G11C 11/4096* (2013.01); *G11C 2207/005* (2013.01)

(58) Field of Classification Search
CPC .......... G11C 16/08; G11C 5/025; G11C 7/18; G11C 8/10
USPC .................................................... 365/230.06
See application file for complete search history.

(56) References Cited

U.S. PATENT DOCUMENTS

| | | | |
|---|---|---|---|
| 5,995,415 A | 11/1999 | Kuo et al. | |
| 2001/0021121 A1* | 9/2001 | Fischer | ............... G11C 11/4076 365/149 |
| 2008/0253218 A1 | 10/2008 | Park | |

FOREIGN PATENT DOCUMENTS

KR    1020110047667 A    5/2011

* cited by examiner

*Primary Examiner* — Vu A Le
(74) *Attorney, Agent, or Firm* — William Park & Associates Ltd.

(57) ABSTRACT

A semiconductor apparatus may include a unit memory region, a first column main decoder, a second column main decoder, and a control circuit. The unit memory region may include a plurality of sub-memory regions. The first and second column main decoders may be configured to receive and decode a column pre-decoding signal and configured to generate a respective column select signal for controlling a column access of a respective first and second half of the plurality of sub-memory regions. The control circuit may be configured to provide the column pre-decoding signal to the first or second column main decoders based on their proximities to a sub-memory region to be enabled among the plurality of sub-memory regions.

16 Claims, 3 Drawing Sheets

SEMICONDUCTOR APPARATUS

CROSS-REFERENCES TO RELATED APPLICATION

The present application claims priority under 35 U.S.C. § 119(a) to Korean application number 10-2017-0176837, filed on Dec. 21, 2017, in the Korean Intellectual Property Office, which is incorporated herein by reference in its entirety.

BACKGROUND

1. Technical Field

Various embodiments of the present disclosure generally relate to column access control for a semiconductor apparatus.

2. Related Art

Referring to FIG. 1, a typical semiconductor memory apparatus 10 includes a cell array region 16 including a plurality of unit memory cells MC connected to word lines WL1 and WL0, a bit line sense amplifier 15 configured to amplify data applied to bit lines BL and BLb, a bit line sense amplifier driver (SA driver) 14 configured to drive power source lines RTO and Sb of the bit line sense amplifier 15 based on enable signals RTOEN and SbEN, a transistor 17 coupling the bit lines BL and BLb with segment input/output lines SIO and SIOb, a transistor 18 coupling the segment input/output lines SIO and SIOb with local input/output lines LIO and LIOb, a data bus sense amplifier (IOSA) 13 configured to transmit data to a global input/output line GIO, a write driver (WDRV) 12 configured to write data inputted from an external device to the unit memory cells, the global input/output line GIO coupled with the write driver 12 and the data bus sense amplifier 13 and configured to transmit data, and an input/output pad 11 coupled to the global input/output line GIO to exchange data with the external device.

The semiconductor memory apparatus performs a read/write operation. First, during the write operation, write data inputted to the input/output pad 11 is transmitted to the write driver 12 via the global input/output line GIO. Thereafter, the write data is transmitted to the segment input/output lines SIO and SIOb via the local input/output lines LIO and LIOb. Subsequently, the write data is transmitted to the bit lines BL and BLb by the transistor 17 and finally used in the unit memory cells.

The read operation is performed in a sequence reverse to the write operation, and data is transmitted to the pad 11 by the data bus sense amplifier 13 in lieu of the write driver 12.

In the above-mentioned semiconductor memory device 10, the transistor 17 coupling the bit lines BL and BLb with the segment input/output lines SIO and SIOb is operated in response to a column select signal YI.

Transmission lines for transmitting the column select signal YI are disposed over the entirety of the cell array region 16.

SUMMARY

In an embodiment of the present disclosure, a semiconductor apparatus may include a unit memory region, including a plurality of sub-memory regions, with a first column main decoder and a second column main decoder. The first column main decoder may be configured to receive and decode a column pre-decoding signal, and it may be configured to generate a first column select signal for controlling a column access of a first half of the plurality of sub-memory regions. The second column main decoder may be configured to receive and decode the column pre-decoding signal, and it may be configured to generate a second column select signal for controlling a column access of a second half of the plurality of sub-memory regions. The semiconductor apparatus may also include a control circuit that may be configured to provide the column pre-decoding signal to the first column main decoder or the second column main decoder based on proximities, of the first column main decoder and the second column main decoder, to a sub-memory region to be enabled among the plurality of sub-memory regions.

In another embodiment, the semiconductor apparatus may also include a column select signal line that may be configured to be shared to transmit the first column select signal and the second column select signal.

DETAILED DESCRIPTION

Various embodiments of the present disclosure may provide a semiconductor apparatus capable of performing stable column access control.

Transmitting a column select signal stably, i.e., to a target location at a predetermined level within a predetermined time, acts as an important factor in enhancing the column access control performance of a semiconductor apparatus.

Hereinafter, a semiconductor apparatus will be described in detail below with reference to the accompanying drawings through various examples of embodiments.

It is also noted that in this specification, the words "connected" and "coupled" refer not only to one component being directly connected or coupling another component but also to cases for which one or more intermediate components are disposed between the components indicated as being connected or coupled. On the other hand, "directly connected" and "directly coupled" refer to components being directly connected or coupled to one another without any intermediate components.

Figure 1:
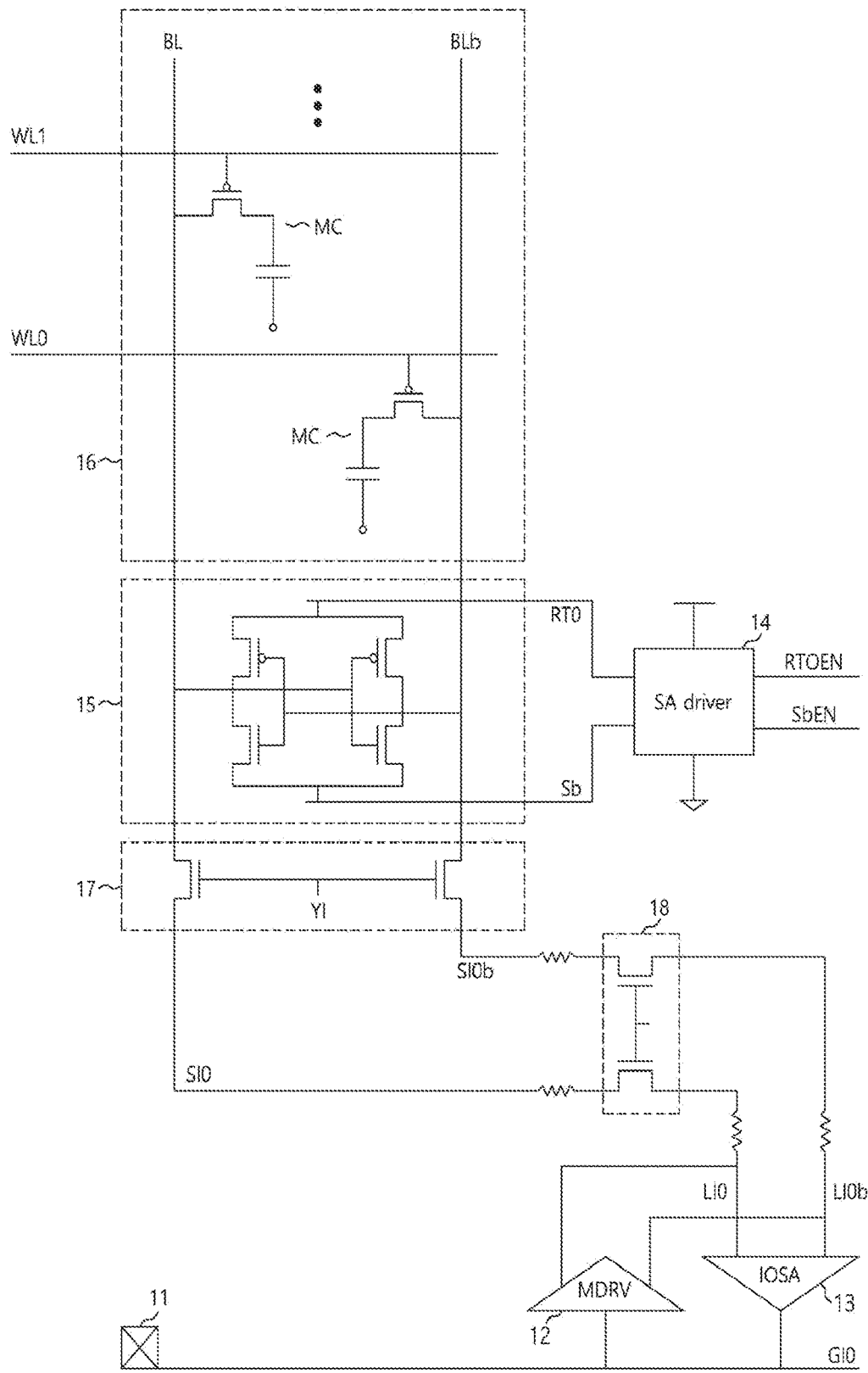
FIG. 1 is a diagram illustrating a configuration of a typical semiconductor apparatus.
Figure 2:
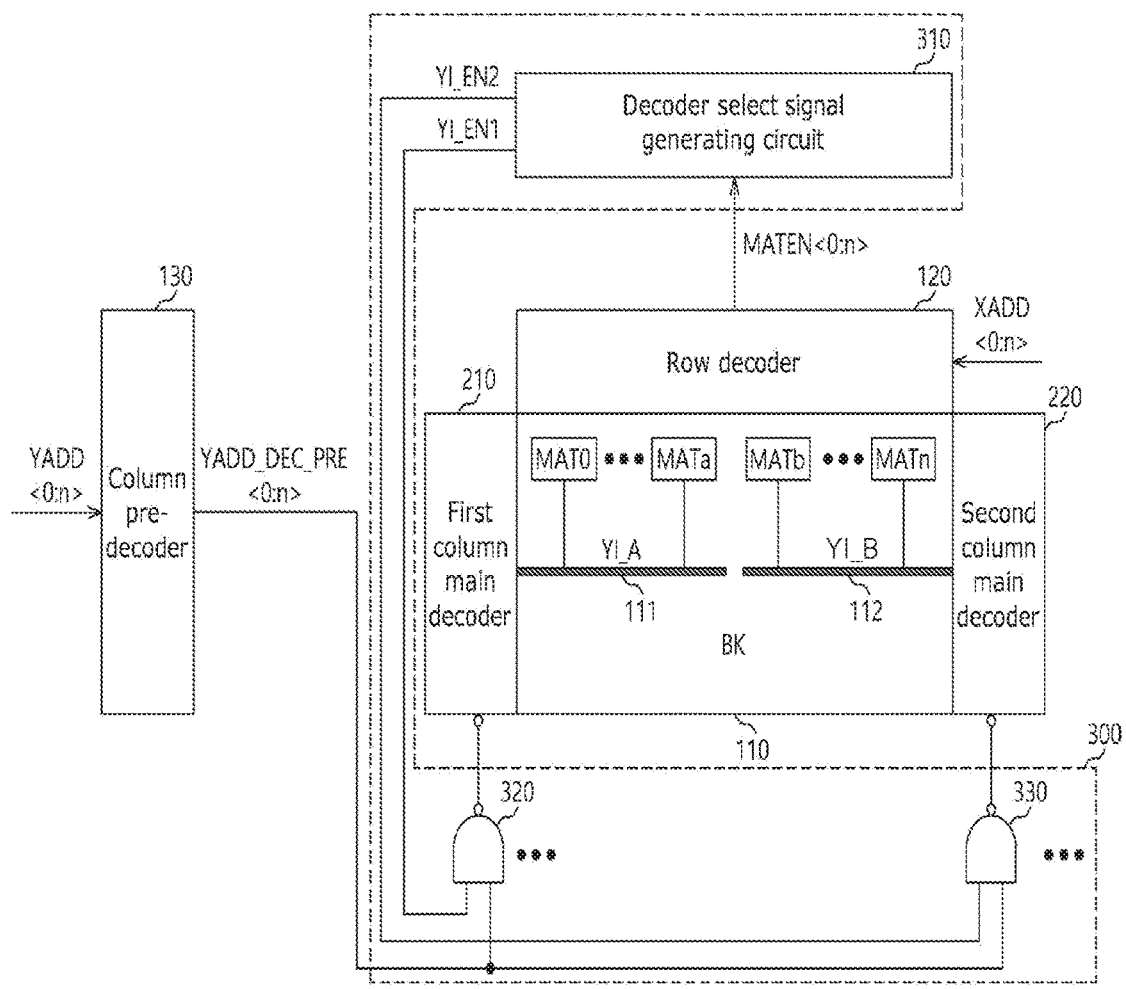
FIG. 2 is a diagram illustrating a configuration of a semiconductor apparatus in accordance with an embodiment.

FIG. 2 is a diagram illustrating a configuration of a semiconductor apparatus 100 in accordance with an embodiment.

Referring to FIG. 2, the semiconductor apparatus 100 in accordance with the embodiment may include a unit memory region 110, a row decoder 120, a column pre-decoder 130, a first column main decoder 210, a second column main decoder 220, and a control circuit 300.

The unit memory region 110 may be formed by dividing an entire cell array region according to a predetermined unit basis (e.g., a memory bank basis), and be one of a plurality of memory banks BK.

Each memory bank BK may include a plurality of sub-memory regions, e.g., a plurality of mats MAT0 to MATn.

The row decoder 120 may decode a row address signal XADD<0:$n$> and select a word line (not shown) of the unit memory region 110.

The row decoder 120 may decode the row address signal XADD<0:$n$> and generate a mat enable signal MATEN<0:$n$>.

Here, the mat enable signal MATEN<0:$n$> may indicate any one mat corresponding to a word line selected according to a result of decoding the row address signal XADD<0:$n$>, among the plurality of mats MAT0 to MATn.

The row decoder 120 may enable any one bit of the mat enable signal MATEN<0:$n$> depending on a value of the row address signal XADD<0:$n$>.

The column pre-decoder 130 may decode a column address signal YADD<0:$n$> and generate a column pre-decoding signal YADD_DEC_PRE<0:$n$>.

The first column main decoder 210 may reinvert an inverted column pre-decoding signal YADD_DEC_PRE<0:$n$> and receive it in an original phase.

The first column main decoder 210 may decode the column pre-decoding signal YADD_DEC_PRE<0:$n$> and generate a first column select signal YI_A for controlling a column access of a first half, e.g., MAT0 to MATa, of the mats MAT0 to MATn.

A first column select signal line 111 for transmitting the first column select signal YI_A may be connected to and may extend from the first column main decoder 210 to a region corresponding to the mats MAT0 to MATa, e.g., the first half of the mats MAT0 to MATn.

The second column main decoder 220 may have the same configuration as that of the first column main decoder 210. That is, the second column main decoder 220 may be a circuit obtained by replicating the first column main decoder 210.

The second column main decoder 220 may reinvert an inverted column pre-decoding signal YADD_DEC_PRE<0:$n$> and receive it in an original phase.

The second column main decoder 220 may decode the column pre-decoding signal YADD_DEC_PRE<0:$n$> and generate a second column select signal Y_B for controlling a column access of a second half, e.g., MATb to MATn, of the mats MAT0 to MATn.

A second column select signal line 112 for transmitting the second column select signal YI_B may be connected to and may extend from the second column main decoder 220 to a region corresponding to the mats MATb to MATn, e.g., the second half of the mats MAT0 to MATn.

In the first column main decoder 210, a driving force (for convenience sake, a first driving force) of a driver (not shown) for driving the first column select signal YI_A to the first column select signal line 111 may be set to a value corresponding to the length of the first column select signal line 111.

In the second column main decoder 220, a driving force (for convenience sake, a first driving force) of a driver (not shown) for driving the second column select signal YI_B to the second column select signal line 112 may be set to a value corresponding to the length of the second column select signal line 112.

For example, the first column select signal YI_A and the second column select signal YI_B may be used as signals for controlling a transistor that couples bit lines with segment input/output lines.

The control circuit 300 may provide an inverted column pre-decoding signal YADD_DEC_PRE<0:$n$> to only one of the first column main decoder 210 and the second column main decoder 220 in response to the mat enable signal MATEN<0:$n$>.

The control circuit 300 may select only one of the first column main decoder 210 and the second column main decoder 220 in response to the mat enable signal MATEN<0:$n$> (here, the selected column main decoder may be the column main decoder which is closer in proximity, than the other column main decoder, to a mat to be enabled among the plurality of mats MAT0 to MATn) and provide the inverted column pre-decoding signal YADD_DEC_PRE<0:$n$> to the corresponding column main decoder.

The control circuit 300 may include a decoder select signal generating circuit 310 and first and second logic gate arrays 320 and 330.

The decoder select signal generating circuit 310 may enable either a first select signal YI_EN1 or a second select signal YI_EN2 in response to the mat enable signal MATEN<0:$n$>.

If the first select signal YI_EN1 is enabled, the first logic gate array 320 may provide the inverted column pre-decoding signal YADD_DEC_PRE<0:$n$> to the first column main decoder 210.

If the first select signal YI_EN1 is enabled, the second select signal YI_EN2 is disabled, so that the second logic gate array 330 might not be able to provide the inverted column pre-decoding signal YADD_DEC_PRE<0:$n$> to the second column main decoder 220.

If the second select signal YI_EN2 is enabled, the second logic gate array 330 may provide the inverted column pre-decoding signal YADD_DEC_PRE<0:$n$> to the second column main decoder 220.

If the second select signal YI_EN2 is enabled, the first select signal YI_EN1 is disabled, so that the first logic gate array 320 might not be able to provide the inverted column pre-decoding signal YADD_DEC_PRE<0:$n$> to the first column main decoder 210.

Figure 3:
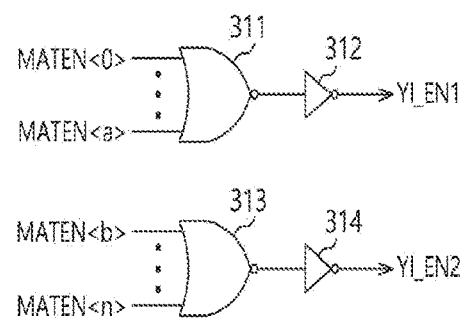
FIG. 3 is a diagram illustrating a configuration of a decoder select signal generating circuit of FIG. 2.

FIG. 3 is a diagram illustrating a configuration of a decoder select signal generating circuit 310 of FIG. 2.

Referring to FIG. 3, the decoder select signal generating circuit 310 may include first to fourth logic gates 311 to 314.

The first logic gate 311 may perform a logical NOR operation on MATEN<0> to MATEN<a>, e.g., a first half of the mat enable signal MATEN<0:$n$>, and output a resultant signal.

The second logic gate 312 may invert the output of the first logic gate 311 and output it as the first select signal YI_EN1.

The third logic gate 313 may perform a logical NOR operation on MATEN<b> to MATEN<n>, e.g., a second half of the mat enable signal MATEN<0:$n$>, and output it as a resultant signal.

The fourth logic gate 314 may invert the output of the third logic gate 313 and output it as the second select signal YI_EN2.

In the case where only one column main decoder is used, a transmission line that is coupled over an entire memory region, which is relatively long compared to that of an embodiment of the present disclosure, should be used as a transmission line for transmitting a column select signal.

In this case where one column main decoder and one transmission line are used, it may be difficult to transmit the column select signal to a target location at a predetermined level due to line loading, and the time it takes to drive the transmission line may also be increased.

Therefore, an embodiment of the present disclosure may be configured such that: two main decoders, i.e., the first column main decoder 210 and the second column main decoder 220, are disposed on opposite sides of the memory bank BK; the column select signal line may also be divided into the first column select signal line 111 and the second column select signal line 112 so as to respectively transmit the first column select signal YI_A and the second column select signal YI_B, i.e., the second column select signal line may be separate from the first column select signal line; and a column select signal may be generated by enabling a main decoder which is comparatively close in proximity to a mat MAT to be enabled. Herein, the corresponding sides of the aforementioned opposite sides of the memory bank BK may be referred to as a first side and a second side.

Consequently, the line loading of the transmission line for transmitting the column select signal may be reduced, whereby the column select signal may be transmitted stably, i.e., to a target location at a predetermined level at a high speed.

Figure 4:
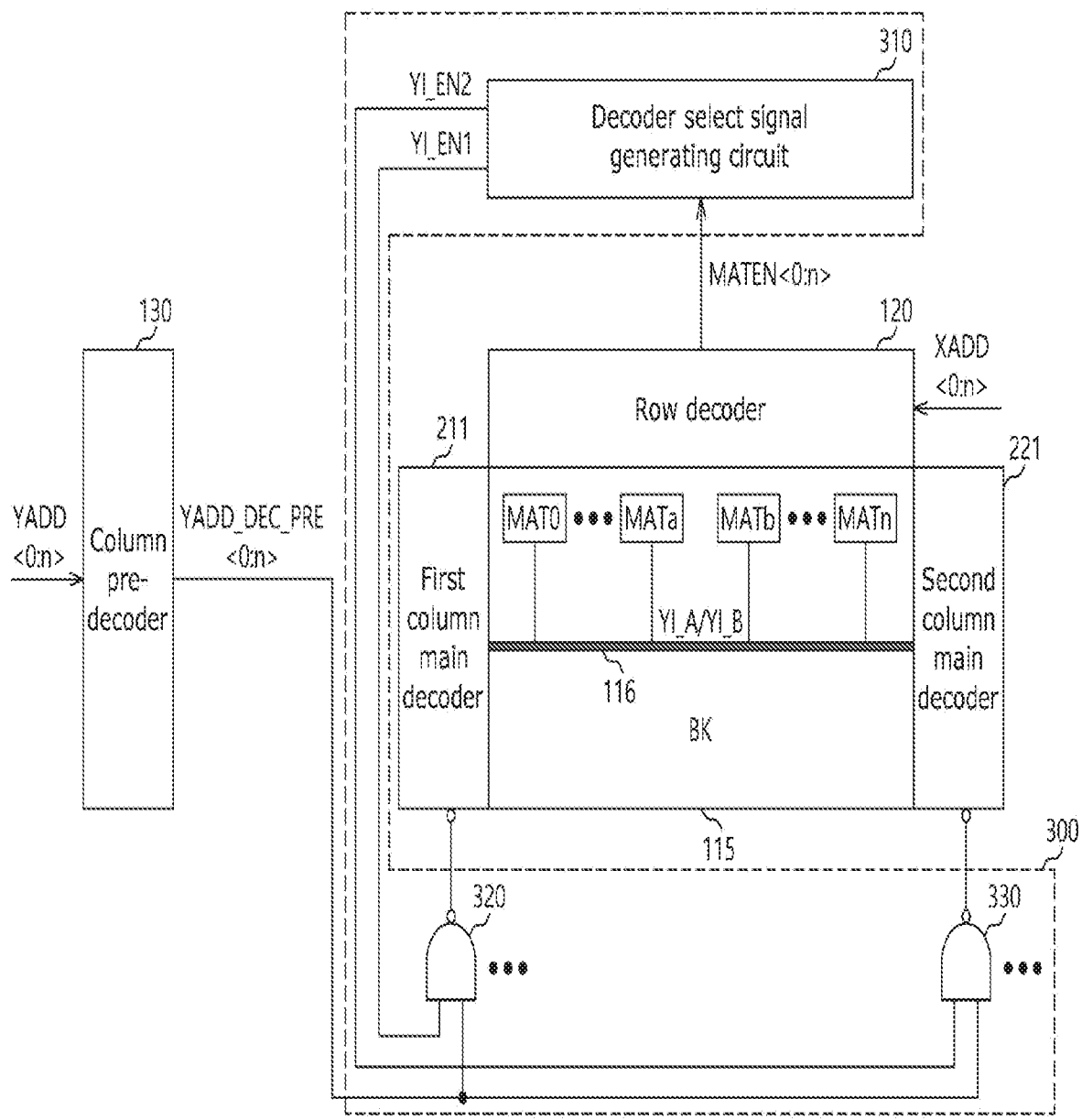
FIG. 4 is a diagram illustrating a configuration of a semiconductor apparatus in accordance with another embodiment.

FIG. 4 is a diagram illustrating a configuration of a semiconductor apparatus 101 in accordance with an embodiment.

Referring to FIG. 4, the semiconductor apparatus 101 in accordance with a present embodiment may include a unit memory region 115, a row decoder 120, a column pre-decoder 130, a first column main decoder 211, a second column main decoder 221, and a control circuit 300.

The row decoder 120, the column pre-decoder 130, and the control circuit 300 may have the same configurations as those of the embodiment described with reference to FIG. 2; therefore, further explanation thereof will be omitted.

The unit memory region 115 may include one integrated column select signal line 116, unlike that of the embodiment described with reference to FIG. 2.

In the first column main decoder 211, a driving force (for convenience sake, a second driving force) of a driver (not shown) for driving a column select signal YI_A to the column select signal line 116 may be set, so as to correspond to the length of the column select signal line 116, to a value greater than the first driving force of the driver of the first column main decoder 210 of FIG. 2.

In the second column main decoder 221, a driving force (for convenience sake, a second driving force) of a driver (not shown) for driving a column select signal YI_B to the column select signal line 116 may be set, so as to correspond to the length of the column select signal line 116, to a value greater than the first driving force of the driver of the second column main decoder 220 of FIG. 2.

The embodiment described with reference to FIG. 4 is similar to an embodiment described with reference to FIG. 2, in terms of the use of two main decoders and the method of controlling the main decoders, but is different from an embodiment of FIG. 2, in terms of the fact that an embodiment of FIG. 4 may share and use one integrated column select signal line.

Therefore, in terms of the line loading, there may be a difference from the embodiment of FIG. 2, but the difference in the line loading may be solved by increasing the driving force, and there may be a relative advantage in terms of design and layout of the column select signal line.

While various embodiments have been described above, it will be understood to those skilled in the art that the embodiments described are examples only. Accordingly, the semiconductor apparatus described herein should not be limited based on the described embodiments.

What is claimed is:

1. A semiconductor apparatus comprising:
   a unit memory region including a plurality of sub-memory regions;
   a first column main decoder configured to receive and decode a column pre-decoding signal and configured to generate a first column select signal for controlling a column access of a first half of the plurality of sub-memory regions;
   a second column main decoder configured to receive and decode the column pre-decoding signal and configured to generate a second column select signal for controlling a column access of a second half of the plurality of sub-memory regions; and
   a control circuit configured to provide the column pre-decoding signal to either the first column main decoder or the second column main decoder based on proximities, of the first column main decoder and the second column main decoder, to a sub-memory region to be enabled among the plurality of sub-memory regions.

2. The semiconductor apparatus according to claim 1, wherein, in the unit memory region, a first column select signal line configured to transmit the first column select signal and a second column select signal line configured to transmit the second column select signal are disposed, and
   wherein the second column select signal line is separate from the first column select signal line.

3. The semiconductor apparatus according to claim 1, wherein the first column main decoder is disposed on a first side of the unit memory region, and
   wherein a first column select signal line configured to transmit the first column select signal is connected to the first column main decoder and extends from the first column main decoder to a region corresponding to the first half of the plurality of sub-memory regions.

4. The semiconductor apparatus according to claim 3, wherein the second column main decoder is disposed on a second side of the unit memory region, and
   wherein a second column select signal line configured to transmit the second column select signal is connected to the second column main decoder and extends from the second column main decoder to a region corresponding to the second half of the plurality of sub-memory regions.

5. The semiconductor apparatus according to claim 1, wherein the control circuit is configured to provide the column pre-decoding signal to either the first column main decoder or the second column main decoder in response to a mat enable signal defining a sub-memory region to be enabled among the plurality of sub-memory regions.

6. The semiconductor apparatus according to claim 5, further comprising a row decoder configured to decode a row address signal and generate the mat enable signal.

7. The semiconductor apparatus according to claim 1, wherein the control circuit comprises:
   a decoder select signal generating circuit configured to enable either a first select signal or a second select signal in response to a mat enable signal defining a sub-memory region to be enabled among the plurality of sub-memory regions;
   a first logic gate array configured to provide the column pre-decoding signal to the first column main decoder when the first select signal is enabled; and
   a second logic gate array configured to provide the column pre-decoding signal to the second column main decoder when the second select signal is enabled.

8. The semiconductor apparatus according to claim 1, wherein the control circuit is configured to provide the column pre-decoding signal to either the first column main decoder or the second column main decoder that is closer in proximity to the sub-memory region to be enabled among the plurality of sub-memory regions.

9. The semiconductor apparatus according to claim 1, further comprising a column pre-decoder configured to decode a column address signal and generate the column pre-decoding signal.

10. A semiconductor apparatus comprising:
a unit memory region including a plurality of sub-memory regions;
a first column main decoder configured to receive and decode a column pre-decoding signal and configured to generate a first column select signal;
a second column main decoder configured to receive and decode the column pre-decoding signal and configured to generate a second column select signal;
a control circuit configured to provide the column pre-decoding signal to either the first column main decoder or the second column main decoder based on proximities, of the first column main decoder and the second column main decoder, to a sub-memory region to be enabled among the plurality of sub-memory regions; and
a column select signal line configured to be shared to transmit the first column select signal and the second column select signal.

11. The semiconductor apparatus according to claim 10, wherein the first column main decoder is disposed on a first side of the unit memory region and connected to a first end of the column select signal line,
wherein the second column main decoder is disposed on a second side of the unit memory region and connected to a second end of the column select signal line, and
wherein the column select signal line extends from the first column main decoder to the second column main decoder.

12. The semiconductor apparatus according to claim 10, wherein the control circuit is configured to provide the column pre-decoding signal to either the first column main decoder or the second column main decoder in response to a mat enable signal defining a sub-memory region to be enabled among the plurality of sub-memory regions.

13. The semiconductor apparatus according to claim 12, further comprising a row decoder configured to decode a row address signal and generate the mat enable signal.

14. The semiconductor apparatus according to claim 10, wherein the control circuit comprises:
a decoder select signal generating circuit configured to enable either a first select signal or a second select signal in response to a mat enable signal defining a sub-memory region to be enabled among the plurality of sub-memory regions;
a first logic gate array configured to provide the column pre-decoding signal to the first column main decoder when the first select signal is enabled; and
a second logic gate array configured to provide the column pre-decoding signal to the second column main decoder when the second select signal is enabled.

15. The semiconductor apparatus according to claim 10, wherein the control circuit is configured to provide the column pre-decoding signal to either the first column main decoder or the second column main decoder that is closer in proximity to the sub-memory region to be enabled among the plurality of sub-memory regions.

16. The semiconductor apparatus according to claim 10, further comprising a column pre-decoder configured to decode a column address signal and generate the column pre-decoding signal.

* * * * *